United States Patent [19]

Sakura

[11] Patent Number: 5,306,664
[45] Date of Patent: Apr. 26, 1994

[54] SEMICONDUCTOR DEVICE, METHOD OF FORMING BUMP ELECTRODE OF A SEMICONDUCTOR DEVICE, METHOD OF PACKAGING A SEMICONDUCTOR DEVICE, CHIP CARRIER TAPE, DISPLAY DEVICE AND ELECTRONIC PRINTING DEVICE INCORPORATING THE SEMICONDUCTOR DEVICE

[75] Inventor: Seiichi Sakura, Suwa, Japan

[73] Assignee: Seiko Epson Corp., Tokyo, Japan

[21] Appl. No.: 883,578

[22] Filed: May 15, 1992

[30] Foreign Application Priority Data

May 16, 1991 [JP] Japan .................................. 3-111383

[51] Int. Cl.$^5$ ............................................. H01L 21/44
[52] U.S. Cl. .................................................... 437/183
[58] Field of Search ............... 361/398, 381, 387, 411, 361/412; 437/183

[56] References Cited

FOREIGN PATENT DOCUMENTS

| | | |
|---|---|---|
| 49-52973 | 5/1974 | Japan . |
| 0012555 | 1/1989 | Japan . |
| 1-227457 | 9/1989 | Japan . |
| 1-227458 | 9/1989 | Japan . |
| 0295433 | 11/1989 | Japan . |

OTHER PUBLICATIONS

Chip–On–Glass Mounting Technology of LSIs For LCD Module, Yoshihiro Bessho et al. IMC 1990 Proceedings, Tokyo, May 30–Jun. 1, 1990 pp. 183–189.

Primary Examiner—Eugene F. Desmond
Attorney, Agent, or Firm—Oliff & Berridge

[57] ABSTRACT

A bump electrode of an inexpensive and reliable semiconductor device is provided in which a remaining metal wire portion produced during bump electrode formation is eliminated. The remaining metal wire portion made in a bump electrode forming method for a semiconductor device using a wire bonding technique is pressed and reshaped from above with heat or ultrasonic waves so as to apply pressure and heat to the bump electrode by using a stamping tool.

21 Claims, 9 Drawing Sheets

SEMICONDUCTOR DEVICE, METHOD OF FORMING BUMP ELECTRODE OF A SEMICONDUCTOR DEVICE, METHOD OF PACKAGING A SEMICONDUCTOR DEVICE, CHIP CARRIER TAPE, DISPLAY DEVICE AND ELECTRONIC PRINTING DEVICE INCORPORATING THE SEMICONDUCTOR DEVICE

BACKGROUND OF THE INVENTION

1. Field of the Invention

The present invention relates to a semiconductor device, a method of forming a bump electrode of a semiconductor device, a method of packaging a semiconductor device, a chip carrier tape, a display device and an electronic printing device incorporating a semiconductor device having a bump electrode formed by the present method.

2. Description of the Related Art

A well-known method for forming a bump electrode of a semiconductor device uses a wire bonding technique. With reference to FIG. 14, a torch such as an electric torch (not shown) is opposed to the leading end of a wire 3 made of, for example, gold, copper, solder or aluminum which is passed through a capillary 1, and a spark is generated between the wire 3 and the electric torch, thereby forming a ball at the leading end of the wire 3. Subsequently, the ball is pressed against an electrode of a semiconductor (e.g., a single crystal silicon) substrate 4 (which can include, for example, an aluminum film 6 and a passivation film 5 thereon) to be joined to the wire 3 by lowering the capillary 1 as shown in FIG. 15. Ultrasonic waves are applied to the edge portion of the electrode terminal to secure the ball to substrate 4. Heat from an unillustrated heater block is also transmitted to the bump electrode 7 through the semiconductor substrate 4. Such heat fuses and fixes the bump electrode 7 onto the electrode of the semiconductor substrate 4. Then, as shown in FIG. 16, the wire 3 is held by closing a clamp 2 and torn by simultaneously raising the wire 3 and clamp 2, so that a bump electrode 7 is formed on the electrode of the semiconductor substrate 4. For an example of this conventional bump electrode formation method see, for example, Japanese Laid-open Patent No. 49-52973.

In the above described method, a portion 8 of the metal wire having a length of from about 10~40 μm remains as a part of the bump electrode due to the growth of crystal grains in the metal wire arising from the heat of the ball when the capillary 1 and wire 3 are raised. Therefore, the height of the bump electrode becomes uneven. FIG. 17 is a photograph of a bump electrode made by this prior art process. Furthermore, the leading end of the bump electrode (the part containing portion 8) is acutely shaped, and thus the bump electrode cannot be brought into uniform contact with other electrodes, terminals, or contacts. These problems make it impossible to obtain good electric continuity, resulting in inconveniences, such as defective continuity and short circuits between electrodes.

In "Chip-On Glass Mounting Technology of LSIs for LCD Module", IMC 1990 proceedings, Tokyo, May 30-Jun. 1, 1990, Yoshihiro Bessho et al disclose applying a conductive adhesive to stud bumps so that LSIs can be bonded to electrode terminals on an LCD panel. Prior to applying the conductive adhesive to the stud bumps, the stud bumps are pressed by a flat surface to level the bumps on the LSI chip. See step (2) on page 187.

OBJECTS AND SUMMARY OF THE INVENTION

It is an object of the present invention to provide a bump electrode for an inexpensive and reliable It is another object of the present invention to provide a semiconductor device having a bump electrode which provides superior electric continuity when electrically coupled to other components.

Accordingly, in order to achieve the foregoing and other objects, and to solve the above and other problems, the present invention forms a bump electrode by reshaping a remaining portion of a metal wire by applying weight to the bump electrode by stamping the bump electrode after the bump electrode has been bonded to the electrode of a semiconductor device. Preferably, the bump electrode is heated to a temperature in the range from 200°-600° C. during stamping, and is stamped with a pressure of 10-40 grams/bump.

A semiconductor device of the present invention is characterized by having a bump electrode reshaped by pressing a remaining portion of a metal wire on the bump electrode by a stamping means using heat and pressure.

BRIEF DESCRIPTION OF THE DRAWINGS

The invention will be described in detail with reference to the following drawings in which like reference numerals refer to like elements, and wherein.

DETAILED DESCRIPTION OF THE PREFERRED EMBODIMENTS

Preferred embodiments of the present invention will now be described specifically.

Figure 1:
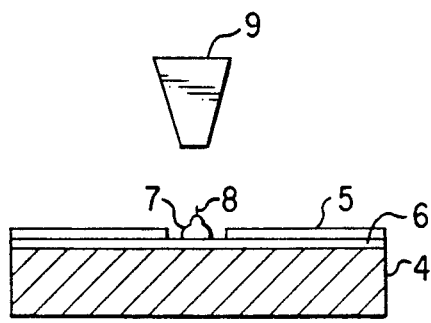
FIG. 1 is a cross-sectional view showing a first embodiment of the present invention prior to stamping a conventionally formed bump electrode.
Figure 8A:
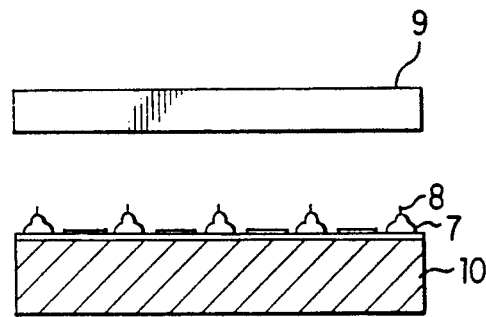
FIGS. 8A-C are front views of the fifth embodiment of the present invention, wherein all bump electrodes on an entire wafer are simultaneously stamped.
Figure 2:
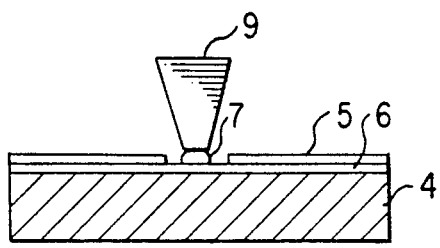
FIG. 2 is a cross-sectional view showing the first embodiment of the present invention during stamping of the bump electrode.
Figure 8B:
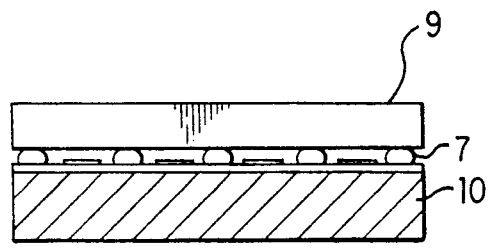
Figure 3:
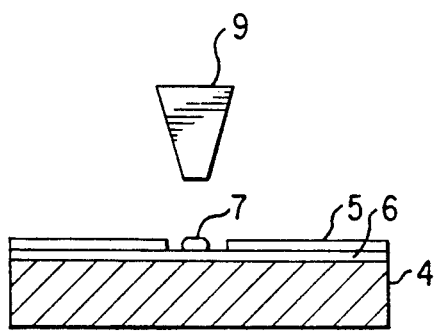
FIG. 3 is a cross-sectional view showing the first embodiment of the present invention after stamping of the bump electrode.
Figure 8C:
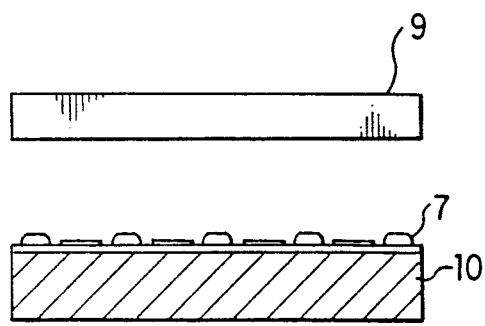

FIGS. 1 to 3 are schematic front views showing a procedure for conducting stamping on a remaining metal wire portion 8 on each bump electrode 7 formed on a semiconductor substrate according to a first embodiment of the present invention.

The bump electrode 7 formed on the semiconductor substrate 4 by the conventional bump electrode forming method includes the remaining metal wire portion 8 formed when wire 3 is torn. Because the amount of the remaining metal wire portion 8 is not fixed (constant), if a connecting terminal (of another component) is positioned above the bump electrode 7 and then joined to the bump electrode 7 by pressure and heat, the joining state of the connecting terminal and the bump electrode 7, that is, the joining strength is not constant. Accordingly, in the present invention, stamping is conducted on the remaining metal wire portion 8 on each bump electrode from above by a stamping tool 9 while using heat or ultrasonic waves (thereby applying heat and pressure to the bump electrode) so that the thickness of the remaining metal wire portion 8 becomes appropriate, thereby reshaping the remaining metal wire portion 8 of the bump electrode 7.

The amount of pressure and heat applied to the bump electrode should be within preferred ranges, to be discussed below, in order to achieve the desired results. In particular, it is preferred to heat the bump electrodes to a temperature in the range from 200°–600° C. while stamping each bump electrode with a pressure in the range from 10–40 grams/bump.

Figure 19:
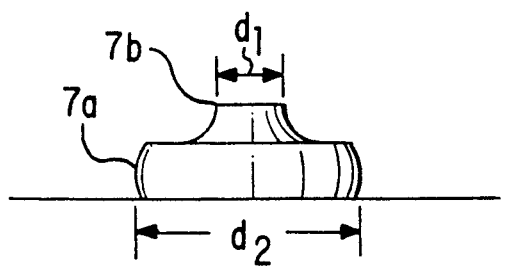
FIG. 19 is a side schematic view of a bump electrode according to the present invention.
Figure 13A:
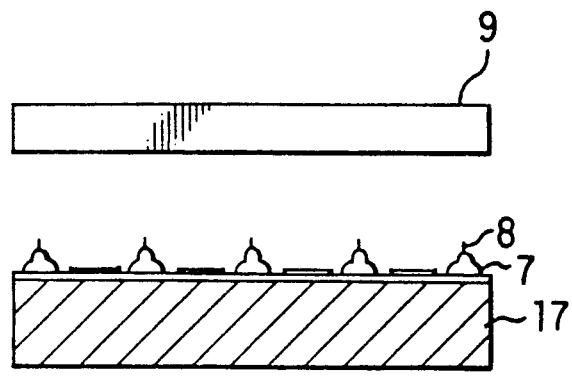
FIGS. 13A-C are front views of the FIG. 12 chip, wherein all bump electrodes on the chip are simultaneously stamped in accordance with another embodiment of the present invention.
Figure 13B:
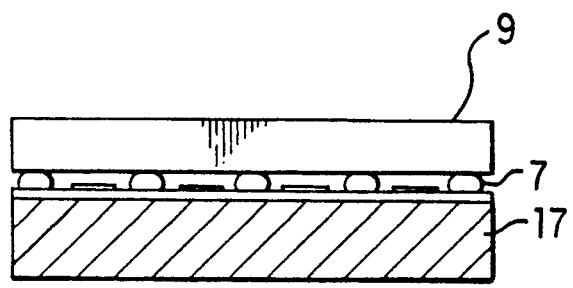
Figure 13C:
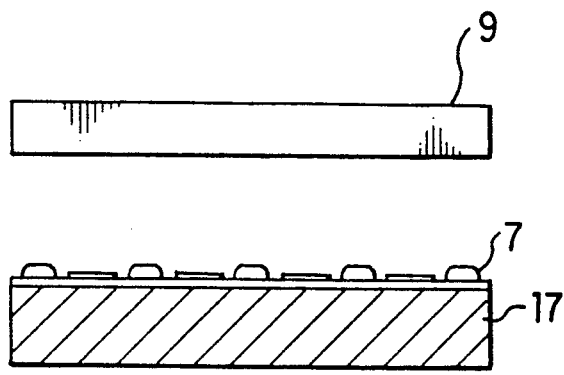
Figure 14:
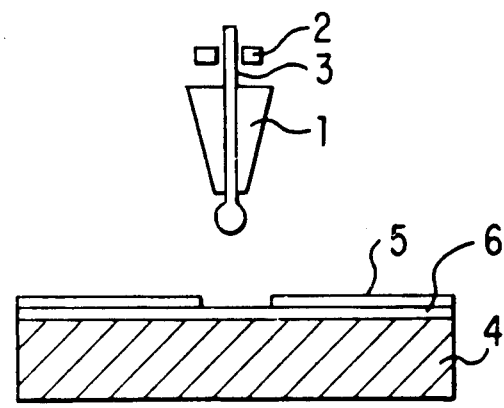
FIG. 14 is a cross-sectional view of a prior art process for forming bump electrodes after the ball is formed at the leading end of a metal wire.
Figure 15:
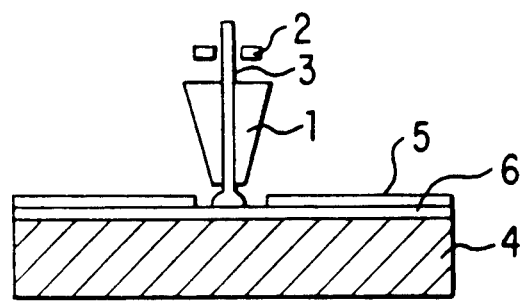
FIG. 15 is a cross-sectional view of the prior art process of FIG. 14 after the ball is contacted with an electrode on a semiconductor substrate.
Figure 16:
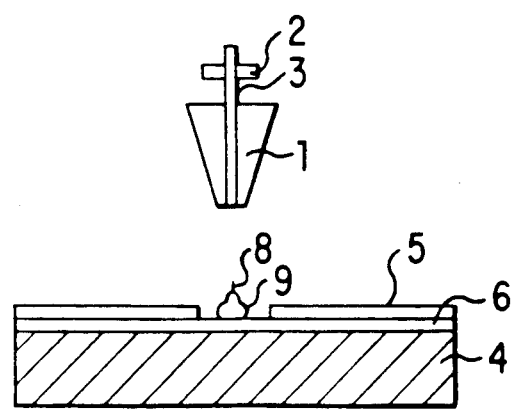
FIG. 16 is a cross-sectional view of the prior art process of FIGS. 14 and 15 after the metal wire is detached from the ball to form the bump electrode.
Figure 17:
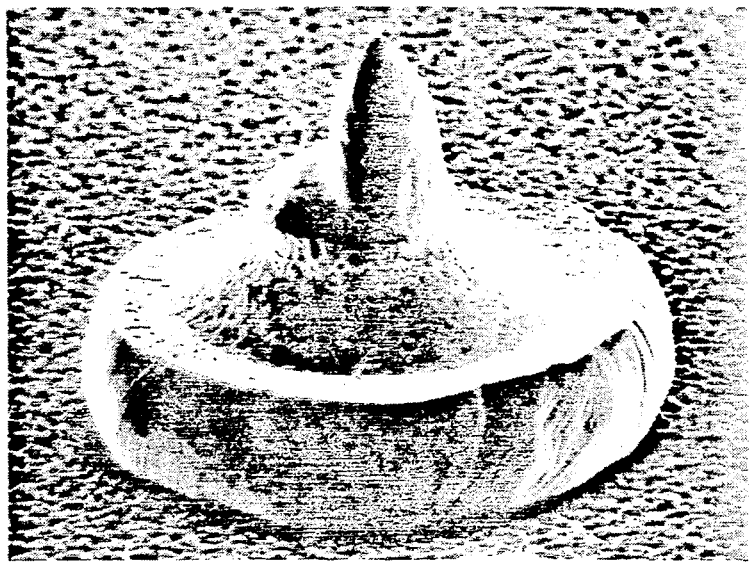
FIG. 17 is a scanning electron microscope (SEM) photograph of a bump electrode made according to the process of FIGS. 14–16.
Figure 18:
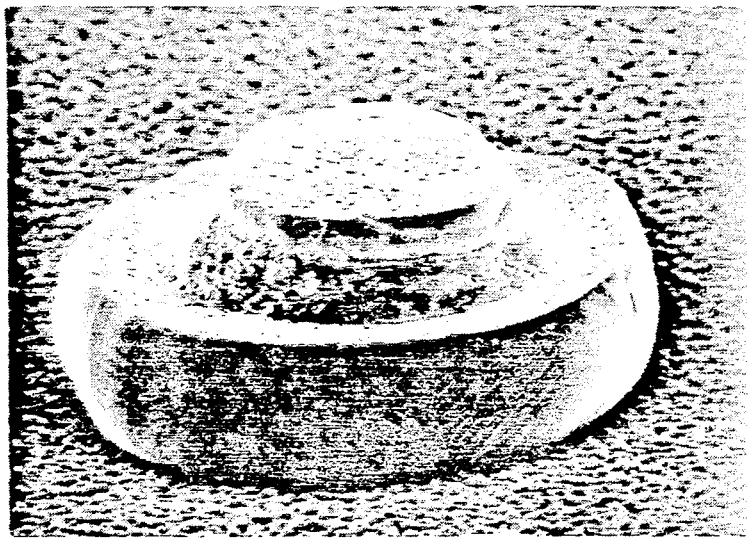
FIG. 18 is a SEM photograph of a bump electrode made according to the present invention.

FIGS. 18 and 19 show a bump electrode made in accordance with the present invention. As can be seen, the bump electrode has a large diameter base portion 7a and a smaller diameter flattened top portion 7b. The diameter $d_2$ of base portion 7a can be about 100 $\mu$m. The diameter $d_1$ of top portion can be from about 25 $\mu$m to about 30 $\mu$m. The total height of each bump electrode 7 can be 15–30 $\mu$m.

Usually, a plurality of bump electrodes 7 are located on a substrate (such as, for example, a chip) in close proximity to each other. For example, the center-to-center distance (pitch) between adjacent electrodes can be about 100 $\mu$m (only slightly larger the diameter $d_2$ of base portion 7a). Thus, it is important to control the heat and temperature applied to each bump electrode so that its base portion 7a does not spread. If too much heat and/or pressure are applied to the bump electrodes, their base portions 7a will spread and contact each other, causing short circuits Additionally, it is important for the smaller diameter flattened top portion 7b to be formed (so that the bump electrode has a two-step structure) to provide a small diameter bonding surface for reasons to be discussed below.

Figure 4A:
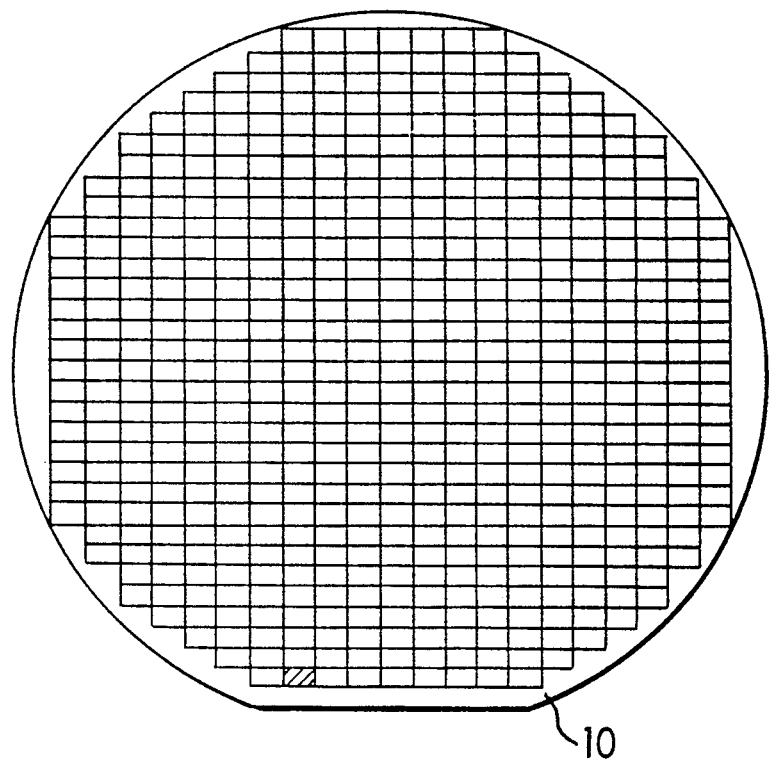
FIGS. 4A-B are plan and front views, respectively, of a second embodiment of the present invention, wherein stamping of bump electrodes is performed in the wafer state.
Figure 4B:
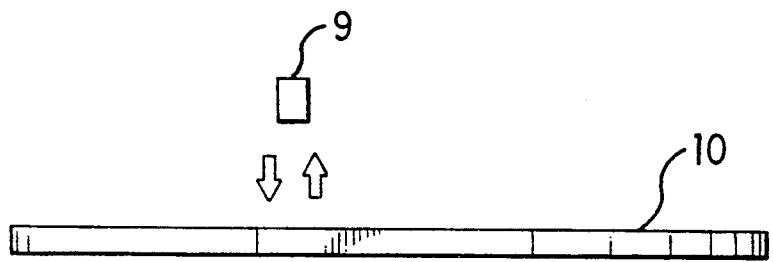

FIGS. 4A-B show a second embodiment of the present invention in which the stamping process shown in FIGS. 1-3 is carried out in the wafer state instead of in the chip state. The stamping is conducted on a bump electrode 7 in each chip on a wafer 10 by a stamping tool 9 while using heat or ultrasonic waves so as to apply pressure and heat as described above.

Figure 5A:
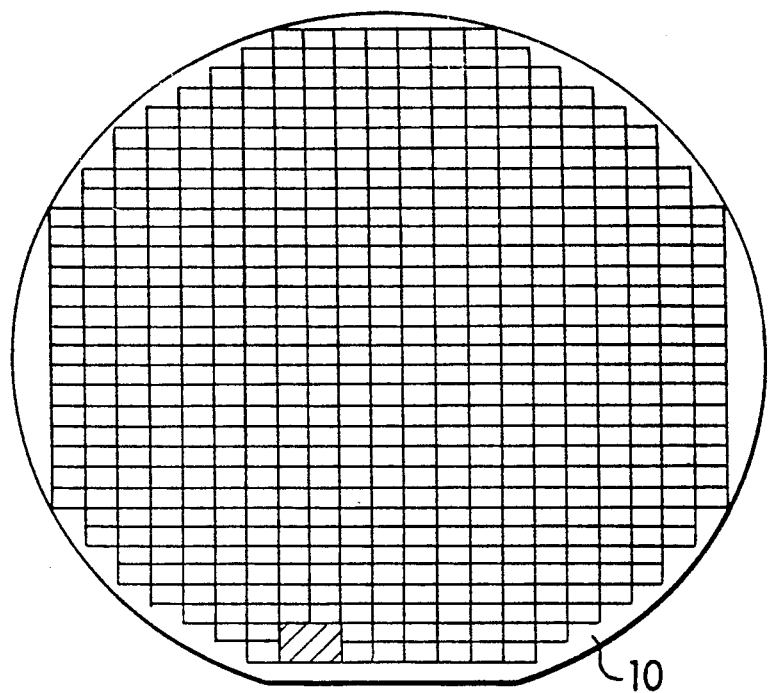
FIGS. 5A-B are plan and front views, respectively, of a third embodiment of the present invention, wherein the bump electrodes of a plurality of semiconductor devices are stamped while in the wafer state.
Figure 5B:
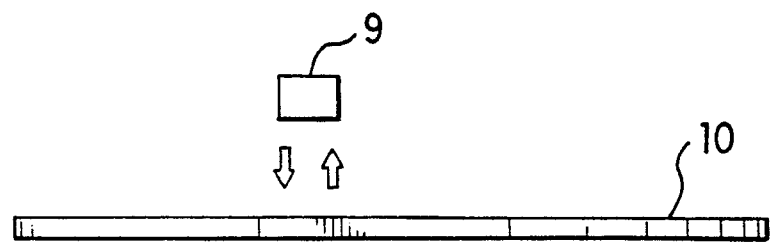

FIGS. 5A-B show a third embodiment of the present invention in which stamping is conducted simultaneously on a plurality of chips (for example, approximately 2~50 chips) on a wafer. This third embodiment differs from the second embodiment in that stamping tool 9 extends over and performs a stamping operation on a plurality of chips on wafer 10 at one time. As described above, heat or ultrasonic waves are applied in addition to the pressure from stamping tool 9.

Figure 6A:
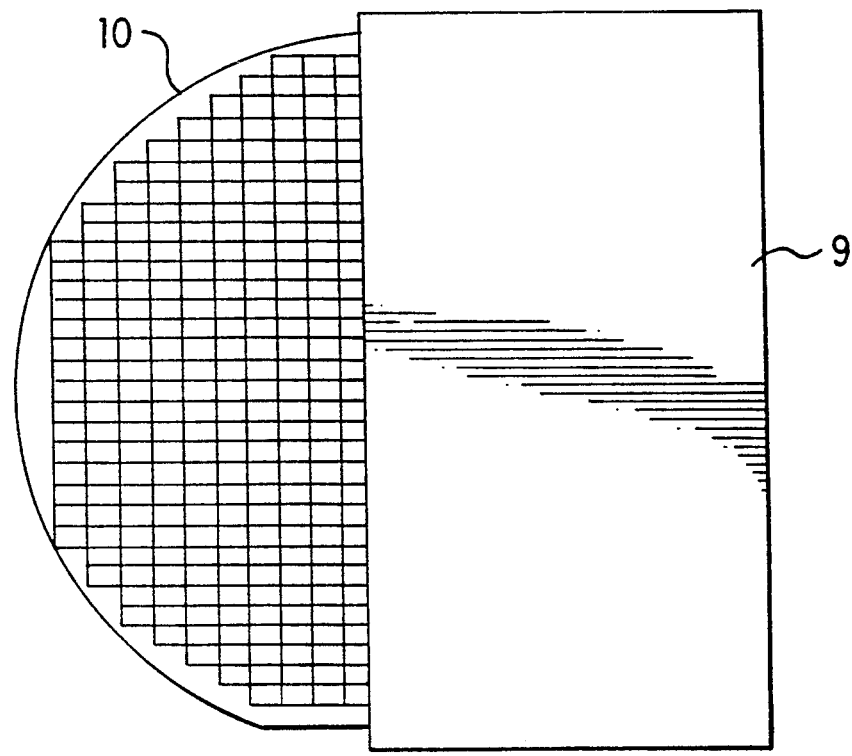
FIGS. 6A-B are plan and front views, respectively, of a fourth embodiment of the present invention, wherein the bump electrodes on half of a wafer are simultaneously stamped.
Figure 6B:
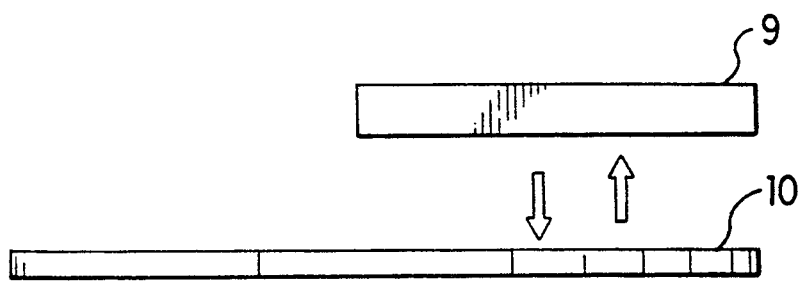
Figure 7:
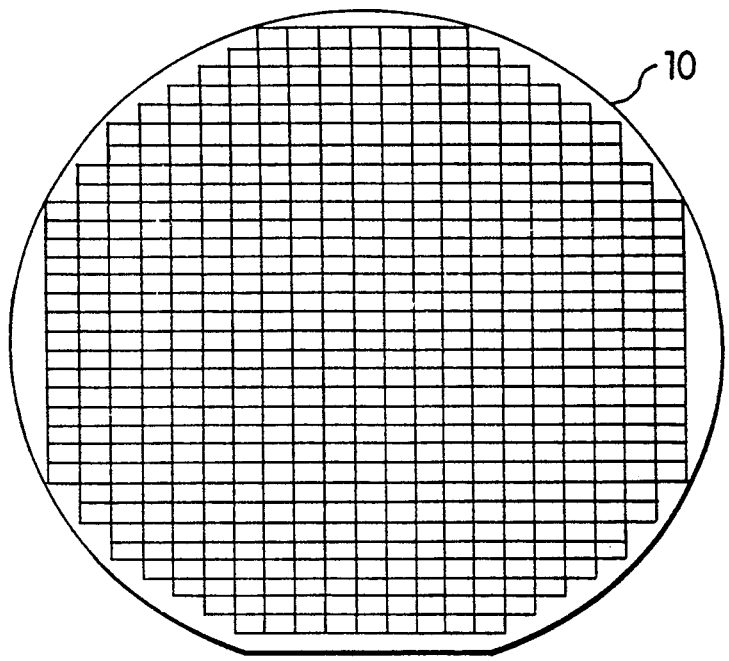
FIG. 7 is a plan view of a wafer containing plural semiconductor devices for use in a fifth embodiment of the present invention.

Furthermore, FIGS. 6A-B show a fourth embodiment of the present invention in which stamping is conducted on each half of the wafer 10 with a stamping device 9 which extends over an area covering half of wafer 10.

FIGS. 7 and 8A-C show a fifth embodiment of the present invention in which stamping is conducted on the whole wafer 10 at one time.

The embodiments of FIGS. 6A-8C also use heat or ultrasonic waves as described above. The embodiments which stamp a plurality of semiconductor devices (or chips) at one time in the wafer state are advantageous because a total processing time is reduced. The time required to perform stamping is from about 0.2 to 1.2 seconds. When stamping is performed on each chip, each stamping procedure takes about 0.2 seconds. Alternatively, it takes about 1.0 second to stamp half of a wafer.

Figure 9:
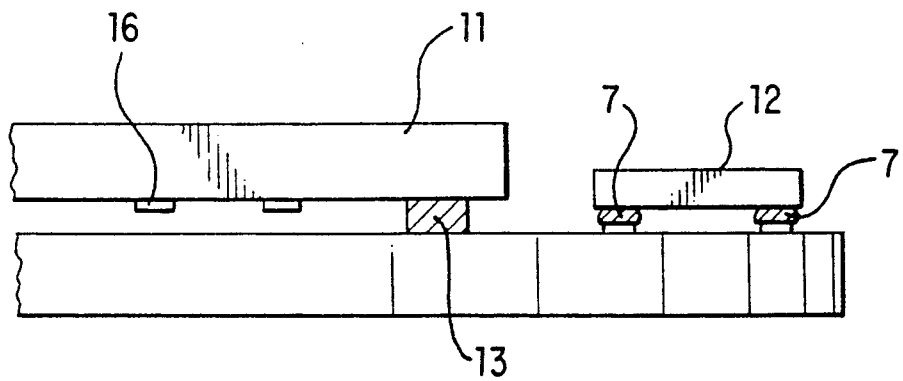
FIG. 9 is a cross-sectional view of a method of packaging a display device wherein a semiconductor device having bump electrodes according to the present invention is attached to an electrode of a display device.

FIG. 9 illustrates a method of packaging a display device in which a bump electrode 7 formed on the electrode of a semiconductor device 12 is electrically connected to the electrode of a display device such as a liquid crystal device (having transparent electrodes 16 and a spacer 13) by using the bump electrode forming method according to the present invention. Specifically, the bump electrodes for semiconductor device 12 face downwardly while being bonded to the electrodes on display device 11.

Figure 10:
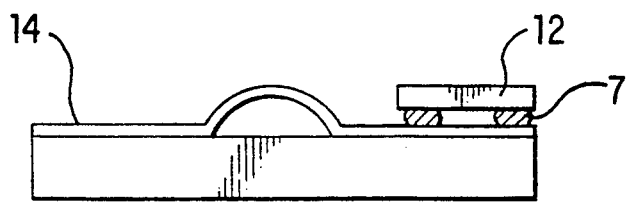
FIG. 10 is a cross-sectional view of an electronic printing device wherein a thermal head is attached to a semiconductor device having bump electrodes according to the present invention.

FIG. 10 illustrates an electronic printing device in which a bump electrode 7 formed on an electrode of a semiconductor device 12 is electrically connected to an electrode of an electronic printing device 14, such as a thermal head. As in the FIG. 9 embodiment, the bump electrodes 7 face downwardly during packaging.

Figure 11:
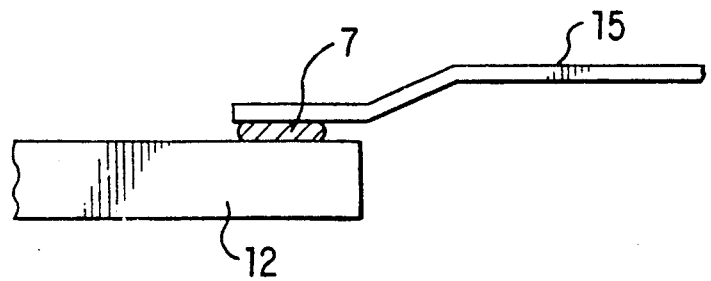
FIG. 11 is a cross-sectional view of a finger lead on a chip carrier attached to a semiconductor device having bump electrodes according to the present invention.
Figure 12:
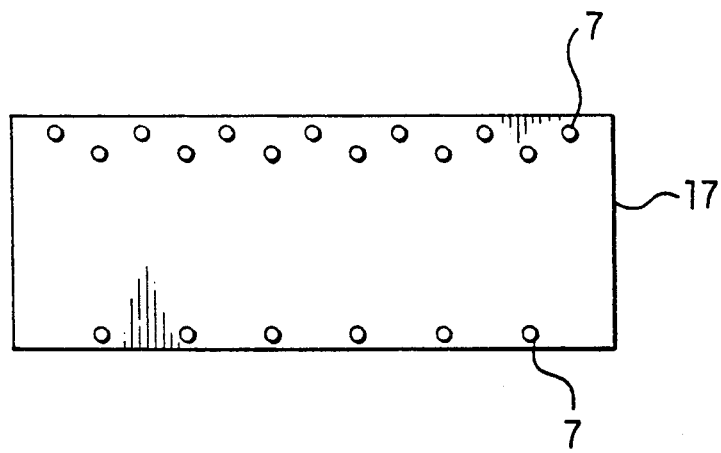
FIG. 12 is a plan view of a chip used in another embodiment of the present invention.

FIG. 11 shows a so-called Tape Automated Bonding (TAB) process in which a bump electrode 7 formed on an electrode of a semiconductor device 12 is connected to a finger lead 15 formed of metal foil on a chip carrier tape. The finger lead is a conductor pattern obtained by forming copper foil on an insulating film, such as polyimide, finely patterning the copper foil by etching and plating the surface of the copper foil with gold, tin, solder or the like. Each finger lead 15 has a width of about 50 μm and a thickness of about 25 μm. Since the 50 μm width of finger leads 15 is less than the 100 μm diameter of bump electrode base portion 7a, it is important to maintain the small (25-30 μm) diameter top portion 7b of each bump electrode 7 for attachment to finger leads 15. If too much heat and/or pressure are applied to the bump electrodes during the stamping process, the entire remaining wire portion 8 is pressed into base portion 7. This undesirably results in a single large diameter surface on the bump electrode which is not suitable for bonding FIGS. 12 and 13A-C illustrate an embodiment of the present invention in which stamping is conducted on each chip 17 so that all bump electrodes 7 on the chip 17 are stamped at the same time. As discussed above, during stamping, the bump electrodes are heated by ultrasonic wave or heat application thereto Because the stamping has only one step in the embodiment of FIGS. 12-13C (instead of individually stamping each bump electrode 7), it is possible to shorten the process time.

As described above, the present invention provides a bump electrode of an inexpensive and reliable semiconductor device by reshaping a remaining metal wire portion (which is made in a bump electrode forming method using ball bonding) by stamping using heat or ultrasonic waves so that pressure and heat is applied to each bump electrode.

While this invention has been described in conjunction with specific embodiments thereof, it is evident that many alternatives, modifications and variations will be apparent to those skilled in the art. For example, although the electrode forming portion 6 of the semiconductor device has been described as an aluminum layer, it is not limited to only that material. Other base metals, such as, for example, chromium or nickel, may be used instead of aluminum. Accordingly, the preferred embodiments of the invention as set forth herein are intended to be illustrative, not limiting. Various changes may be made without departing from the spirit and scope of the invention as described in the following claims.

What is claimed is:

1. A method of forming at least one bump electrode of at least one semiconductor device located on a wafer containing plural semiconductor devices in which a sphere of metal is placed onto an electrode of a semiconductor substrate with heat by bringing a leading end of a metal wire into contact with said electrode and then cutting said metal wire so as to form a bump electrode including said sphere on said electrode, a portion of said metal wire remaining on and extending from said bump electrode after said metal wire is cut, said method comprising: reshaping said at least one bump electrode by heating and applying pressure to said remaining wire portion using stamping means so as to flatten an upper portion of said bump electrode while said at least one semiconductor device is attached to said wafer.

2. The method of claim 1, wherein a single semiconductor device is stamped at one time by said stamping means.

3. The method of claim 2, wherein a plurality of bump electrodes of said single semiconductor device are simultaneously stamped by said stamping means.

4. The method of claim 1 wherein a plurality of bump electrodes of said at least one semiconductor device are simultaneously stamped by said stamping means.

5. The method of claim 4, wherein said plurality of stamped bump electrodes each have a flat upper portion with a diameter in the range from 25 to 30 μm, and a lower base portion having a diameter greater than the diameter of said flat upper portion.

6. The method of claim 1, wherein bump electrodes of a plurality of semiconductor devices are simultaneously stamped by said stamping means.

7. The method of claim 6, wherein said bump electrodes on said plurality of simultaneously stamped semiconductor devices each have a flat upper portion with a diameter in the range from 25 to 30 μm, and a lower base portion having a diameter greater than the diameter of said flat upper portion.

8. The method of claim 1, wherein the bump electrodes of all semiconductor devices attached to said wafer are simultaneously stamped by said stamping means.

9. The method of claim 1, wherein said stamping performed by said stamping means causes said at least one bump electrode to have a thickness in the range from 15 to 30 μm.

10. The method of claim 1, wherein said stamping means applies a pressure in the range from 10 to 40 grams to said at least one bump electrode.

11. The method of claim 10, wherein said at least one bump electrode is heated to a temperature in the range from 200 to 600° C. during said stamping.

12. The method of claim 1, wherein said at least one bump electrode has a flat upper portion with a diameter in the range from 25 to 30 μm, and a lower base portion having a diameter greater than the diameter of said flat upper portion.

13. The method of claim 1, further comprising the step of separating said at least one semiconductor device containing said at least one reshaped bump electrode from said wafer.

14. The method of claim 13, further comprising attaching said at least one bump electrode of said separated at least one semiconductor device to a finger lead of a chip carrier tape.

15. The method of claim 14, wherein said finger lead is made of metal foil on an insulating film.

16. The method of claim 13, further comprising attaching said at least one bump electrode of said separated at least one semiconductor device to a terminal of a wiring pattern on a substrate of an electronic circuit device.

17. The method of claim 16, wherein said electronic circuit device is part of a display device.

18. The method of claim 16, wherein said electronic circuit device is part of an electronic printing device.

19. The method of claim 13, further comprising attaching said at least one bump electrode of said separated at least one semiconductor device to a wiring pattern in a substrate of an electronic circuit device using a face down packaging process.

20. The method of claim 19, wherein said electronic circuit device is part of a display device.

21. The method of claim 19, wherein said electronic circuit device is part of an electronic printing device.

* * * * *